US007053730B2

(12) United States Patent  (10) Patent No.: US 7,053,730 B2
Park et al.  (45) Date of Patent: May 30, 2006

(54) FABRICATING METHODS FOR AIR-GAP TYPE FBARS AND DUPLEXERS INCLUDING SECURING A RESONATING PART SUBSTRATE TO A CAVITY FORMING SUBSTRATE

(75) Inventors: Yun-kwon Park, Dongducheon-si (KR); In-sang Song, Seoul (KR); Byeoung-ju Ha, Yongin-si (KR); Il-jong Song, Suwon-si (KR); Duck-hwan Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 10/825,608

(22) Filed: Apr. 16, 2004

(65) Prior Publication Data

US 2004/0257171 A1 Dec. 23, 2004

(30) Foreign Application Priority Data

Apr. 18, 2003 (KR) ............... 10-2003-0024720
Jul. 21, 2003 (KR) ............... 2003-49918

(51) Int. Cl.
 *H03H 9/70* (2006.01)
 *H03H 3/007* (2006.01)
 *H03H 9/10* (2006.01)
(52) U.S. Cl. ............ 333/133; 333/189; 29/25.35; 438/51; 310/322
(58) Field of Classification Search ........ 333/187, 333/189, 133; 310/322, 324; 29/25.35; 438/51; 216/2, 13; 427/100
See application file for complete search history.

(56) References Cited

U.S. PATENT DOCUMENTS

| 4,692,726 | A | 9/1987 | Green et al. ............. 333/206 |
| 6,509,813 | B1* | 1/2003 | Ella et al. .............. 333/187 |
| 6,713,314 | B1* | 3/2004 | Wong et al. ............. 438/25 |
| 6,787,970 | B1* | 9/2004 | Shim et al. ............. 310/312 |
| 6,894,383 | B1* | 5/2005 | Bar-Sadeh et al. ....... 257/704 |
| 2002/0109430 | A1* | 8/2002 | Tsai et al. ............. 310/311 |
| 2002/0109564 | A1* | 8/2002 | Tsai et al. ............. 333/187 |
| 2002/0121337 | A1* | 9/2002 | Whatmore et al. ........ 156/285 |
| 2003/0189242 | A1* | 10/2003 | Ma et al. .............. 257/678 |

FOREIGN PATENT DOCUMENTS

| EP | 1 180 494 | 2/2002 |
| EP | 1 253 713 | 10/2002 |
| JP | 01-157108 | 6/1989 |
| JP | 09-064675 | * 3/1997 |
| JP | 2001-251159 | 9/2001 |
| JP | 2002-076824 | 3/2002 |

* cited by examiner

*Primary Examiner*—Barbara Summons
(74) *Attorney, Agent, or Firm*—Lee & Morse, P.C.

(57) ABSTRACT

An air-gap type film bulk acoustic resonator (FBAR) is created by securing two substrate parts, one providing a resonance structure and the other providing a separation structure, i.e., a cavity. When the two substrate parts are secured, the resonance structure is over the cavity, forming an air gap isolating the resonant structure from the support substrate. The FBAR may be used to form a duplexer, which includes a plurality of resonance structures, a corresponding plurality of cavities, and an isolation part formed between the cavities. The separate creation of the resonance structures and the cavities both simplifies processing and allows additional elements to be readily integrated in the cavities.

19 Claims, 13 Drawing Sheets

FABRICATING METHODS FOR AIR-GAP TYPE FBARS AND DUPLEXERS INCLUDING SECURING A RESONATING PART SUBSTRATE TO A CAVITY FORMING SUBSTRATE

BACKGROUND

1. Field of the Invention

The present invention relates to a film bulk acoustic resonator (FBAR) and a duplexer using the FBAR. More particularly, the present invention is directed to an air-gap type FBAR and a duplexer fabricated through a simple substrate-securing process, and fabricating methods thereof.

2. Description of the Related Art

As mobile communication devices, such as cellular telephones, become increasingly prevalent, demand for compact, lightweight filters used in such devices is also rising. Film bulk acoustic resonators (FBARs) can be used as such compact, lightweight filters and can be inexpensively mass-produced. Also, the FBAR can obtain a high quality factor (Q) value, can be used in a micro-frequency band, and, more particularly, can be implemented up to PCS (Personal Communication System) and DCS (Digital Cordless System) bands.

Generally, the FBAR is implemented by laminating a first electrode, a piezoelectric layer, and a second electrode on a substrate in that order. In operation, an electric field, which varies with time, is induced in the piezoelectric layer by applying electric energy to the electrodes. This electric field causes a bulk acoustic wave to be generated in a vibrating direction of the piezoelectric layer, thereby generating resonance.

FIGS. 1A to 1C illustrate cross-sections of a Bragg reflector type FBAR, a bulk micro-machining type FBAR, and a surface micro-machining type FBAR, respectively. Each of these types of FBARs provides separation between the substrate and the multi-layer resonance section in different manners. The separation is needed so that acoustic waves generated from the piezoelectric layer are not affected by the substrate.

The Bragg reflector type FBAR in FIG. 1A includes a substrate 10, a reflector structure 11, a lower electrode 12, a piezoelectric layer 13, and an upper electrode 14 in that order. The reflector structure 11 includes a plurality of dielectric layers alternating between low impedance and high impedance materials to insure efficient confinement of the acoustic energy in the resonator. Thus, elastic-wave energy, which has passed through the piezoelectric layer, is not transferred to the substrate 10, but is wholly reflected by the reflector structure 11 to generate an efficient resonance. The Bragg reflector type FBAR is robust and is subject to no bending stresses. However, precise thickness control of the layers of the reflection structure 11 for the total reflection in such a Bragg reflector type FBAR is not easy and increases the manufacturing cost.

The bulk micro-machining type FBAR in FIG. 1B includes a membrane 21 of a material, such as $SiO_2$, on a substrate 20, a cavity 23, formed by anisotropic-etching the rear surface of the substrate 20, and an acoustic resonator 22 on the membrane. Again, the acoustic resonator 22 includes a lower electrode, a piezoelectric layer and an upper electrode. The bulk micro-machining type FBAR is very weak structurally, making its implementation impractical.

The surface micro-machining type FBAR in FIG. 1C includes a substrate 30, an air gap 31, a dielectric layer 32, and a first electrode 33, a piezoelectric layer 34 and a second electrode 35 on the dielectric layer 32 in sequential order. This FBAR is fabricated using a sacrificial layer on the substrate 30 and forming the dielectric layer 32, on the sacrificial layer, forming the resonator structure on the dielectric layer 32, and then removing the sacrificial layer to form the air gap 31. That is, the air gap 31 is formed in a position where the sacrificial layer existed. The surface micro-machining type FBAR, has a complicated fabricating process and the resonance structure may cave in or peel off during the fabricating process.

Also, the above conventional FBARs have the common problem in that separate packaging, which requires lots of time and expense, is needed after the FBAR has been fabricated, and the FBAR may be damaged due to heat generated during the packaging process.

A duplexer is a representative element that uses multiple filters. The duplexer properly branches signals transmitted/received through one antenna in a frequency division type communication system so that the same antenna can efficiently both transmit and receive. The duplexer basically includes a transmitter filter and a receiver filter in addition to an antenna. The transmitter filter is a band pass filter for passing only a frequency to be transmitted, and the receiver filter is a band pass filter for passing only a frequency to be received. The duplexer can perform the signal transmission/reception through one antenna by adjusting the frequencies passing through the transmitter filter and the receiver filter. The duplexer can improve its performance using the FBAR as its transmitting/receiving filter.

Since the difference between the frequencies of the signals transmitted/received through the transmitter filter and the receiver filter is small, the signals influence each other giving rise to interference. Accordingly, an isolation part that isolates the transmitter filter and the receiver filter from each other to prevent mutual interference may be incorporated in the duplexer to improve performance. The isolation part includes a phase shifter using a capacitor and a resistor, and prevents the mutual interference by introducing a phase difference of 90° between the frequencies of the transmitted signal and the received signal.

The duplexer in FIG. 2A includes a transmitter filter 41, a receiver filter 42, and an isolation part 43 for isolating the two filters from each other on a printed circuit board (PCB) 40. The transmitter filter 41 and the receiver filter 42 are wire bonded to the PCB 40, creating a hybrid design. This duplexer can be fabricated using the air-gap type FBAR as shown in FIGS. 1B and 1C. However, the separate packaging for each FBAR increases the size of the duplexer, reducing the usefulness of the duplexer in miniaturized devices. Also, losses due to the wire bonding may occur.

FIG. 2B shows a duplexer fabricated on one substrate 50 using the Bragg type FBAR of FIG. 1A. Only details of a representative FBAR 60 will be discussed below. The FBAR 60 includes a reflector layer 64 formed by alternating layers of materials having greatly different acoustic impedances, a lower electrode 63, a piezoelectric layer 62, and an upper electrode 61 in that order, as a filter. As shown in FIG. 2B, the receiver filter includes a serial resonator 60 and a parallel resonator 70, and the transmitter filter includes a serial resonator 80 and a parallel resonator 90, all of which are integrated onto one substrate 50. The Bragg type duplexer is fabricated on one substrate to effect a one-chip fabrication. The Bragg type duplexer has a strong structure, but it is difficult to accurately adjust the width of the respective layers, and the thin film is easily cracked due to the stress caused during formation of the thick reflector layer. Further, the Bragg type duplexer has a greatly lowered Q value compared to a duplexer using an air gap type FBAR.

SUMMARY

The present invention is therefore directed to an air gap type film bulk acoustic resonator (FBAR), a duplexer including the FBAR, and a manufacturing method for both, which substantially overcome one or more of the problems due to the limitations and disadvantages of the related art.

It is a feature of the present invention to provide a robust, simply fabricated air-gap type FBAR. It is another feature of the present invention is to provide to a duplexer including a robust, simply fabricated air-gap type FBAR and an isolation part, and a fabricating method thereof. It is yet another feature of the present invention to create such a robust, simply fabricated FBAR using a substrate securing process.

At least one of the above and other features may be realized by providing an air-gap type FBAR including a substrate having a cavity in an upper surface of the substrate, a first dielectric layer on the upper surface of the substrate around the cavity, a resonance part, and a second dielectric layer formed on the resonance part. The resonance part may include a first electrode on part of the first dielectric layer, a second electrode on the first dielectric layer, exclusive of the first electrode, and a piezoelectric layer between the first and second electrodes. The FBAR may include a via exposing a pad for providing electrical contact with the first and second electrodes.

A conductive layer may be provided on a bottom surface of the cavity. A passive and/or active element may be integrated on a bottom surface of the cavity. A substrate film of a predetermined thickness may be on the second dielectric layer. The FBAR may further include a third dielectric layer on a portion of a surface of the substrate film and a second substrate contacting the third dielectric layer, the second substrate including a cavity formed apart from where the second substrate contacts the third dielectric layer.

At least one of the above and other features may be realized by providing a method of fabricating an air-gap type FBAR including forming a resonance part on a first substrate, forming a cavity in a second substrate, securing the first substrate with the second substrate so that the resonance part is located in the cavity, and packaging by removing at least part of the first substrate after the securing. The forming of the resonance part may include sequentially providing a first dielectric layer, a first electrode, a piezoelectric layer, and a second electrode on the first substrate. A pad may be formed by exposing part of the first and second electrodes by removing corresponding portions of the first dielectric layer part of the resonance part.

The forming of the resonant part may further include depositing the first dielectric layer on the first substrate, selectively depositing the first electrode on the first dielectric layer, selectively depositing the piezoelectric layer on the first electrode and the first dielectric layer, and selectively depositing the second electrode on the first electrode, the first dielectric layer and the piezoelectric layer.

The forming of the cavity may include depositing a second dielectric layer on the second substrate, exposing part of the second substrate surface by removing part of the second dielectric layer, and etching the exposed part of the second substrate to form the cavity. The securing of the first and second substrates may include bringing the first substrate and the second dielectric layer on the second substrate into contact.

A conductive layer may be selectively deposited on a bottom surface of the cavity before the securing. An active and/or passive element may be integrated on a bottom surface of the cavity before the securing. A resonance frequency of the FBAR may be tuned by controlling a thickness of the first dielectric layer in the resonance part. The securing may include bonding using adhesive bonding and/or eutectic bonding. The packaging may include etching the first substrate to a predetermined thickness or completely removing the first substrate. The packaging may include selectively depositing a third dielectric layer on a third substrate leaving an exposed part of the third substrate surface, forming another cavity by etching the exposed part of the third substrate, and securing the third substrate with the first substrate at the third dielectric layer.

At least one of the above and other features may be realized by providing a single-chip duplexer having a FBAR filter including a substrate having first and second cavities formed on an upper surface of the substrate, a first dielectric layer deposited on the upper surface of the substrate around the first and second cavities, a first air-gap type FBAR including a first resonance part over the first cavity, a second air-gap type FBAR including a second resonance part over the second cavity, and an isolation part between the first air-gap type FBAR and the second air-gap type FBAR.

Each resonance parts may include a lower electrode on an upper surface of the first dielectric layer on one side of a cavity and extending over the cavity, an upper electrode on the upper surface of the first dielectric layer on an opposite side of the cavity and extending over the cavity, and a piezoelectric layer formed between the lower electrode and the upper electrode over the cavity.

One of the first and second air-gap type FBARs may act as a transmitter filter, and the other may act as a receiver filter. The transmitter filter and the receiver filter may be implemented by connecting more than one air-gap type FBARs.

The isolation part may include a capacitor and a resistor, and introduce a phase difference between frequencies of signals input to the transmitter filter and the receiver filter. The isolation part may include a second dielectric layer on the substrate, a first conductive layer on part of the upper surface of the second dielectric layer, a third dielectric layer on part of the first conductive layer and on part of the upper surface of the second dielectric layer, a second conductive layer on part of the third dielectric layer over the first conductive layer and on part of the third dielectric layer below which the first conductive layer is not present, an insulating film on part of the second conductive layer and on an upper part of the third dielectric layer, and a conductive coil on an upper part of the insulating film and on upper parts of exposed first and second conductive layers.

At least one of the above and other features may be realized by providing a method of fabricating a single-chip duplexer using an air-gap type FBAR filter, including forming a first substrate part having first and second resonance parts formed at predetermined intervals on a surface of a first substrate, forming a second substrate part including forming first and second cavities at the predetermined intervals on a second substrate and forming an isolation part between the first and second cavities, securing the first substrate part and the second substrate part so that the isolation part is located between the first and second resonance parts and the first and second resonance parts are over the first and second cavities, respectively, and removing the first substrate of the first substrate part after the securing.

The forming of the first substrate part may include selectively depositing a first dielectric layer on the first substrate to form first and second dielectric portions for the first and second resonance parts, respectively, depositing first and second lower electrodes on part of the first and second dielectric portions, respectively, forming first and second piezoelectric layers on part of the first and second lower electrodes, respectively, and depositing first and second upper electrodes on the piezoelectric layers and on part of the first and second dielectric portions not having the first and second lower electrodes, respectively.

The forming of the second substrate part may include selectively depositing a second dielectric layer on the second substrate forming first and second dielectric portions spaced apart from each other at a distance corresponding to a distance between the first and second resonance parts and etching the second substrate without the second dielectric layer to form the first and second cavities. The forming of the second substrate may further include forming a capacitor having two conductive layers and a dielectric layer between the two conductive layers, and forming a coil of another conductive layer on an upper part of the capacitor to form an inductor. The forming of the second substrate part may further include depositing a first conductive layer on part of the second dielectric layer located between the first and second cavities, depositing a third dielectric layer on part of the first conductive layer and on the second dielectric layer, depositing a second conductive layer on the third dielectric layer over the first conductive layer and on part of the third dielectric layer not over the first conductive layer, coating an insulating film on part of the second conductive layer and on part of the third dielectric layer, and depositing a third conductive layer including forming a coil on exposed first and second conductive layers and on part of the insulating film.

The method may further include forming a pad by removing part of the first dielectric layer to expose lower and upper electrodes of the first and second resonance parts. The securing may include bonding the first and second substrate parts using adhesive bonding and/or eutectic bonding. The method may include forming at least two resonance parts on the first substrate, and at least two cavities on the second substrate, a number resonance parts being equal to a number of cavities.

BRIEF DESCRIPTION OF THE DRAWINGS

The above and other features and advantages of the present invention will become readily apparent to those of skill in the art by describing in detail embodiments thereof with reference to the attached drawings, in which.

DETAILED DESCRIPTION

Figure 1A:
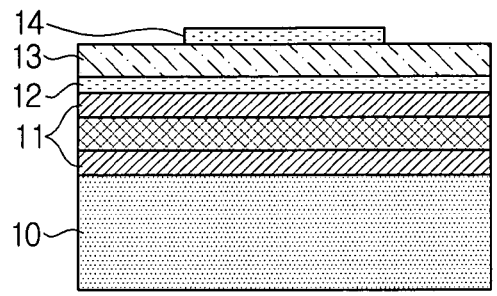
FIG. 1A illustrates a cross-section of a Bragg reflector type FBAR.
Figure 1B:
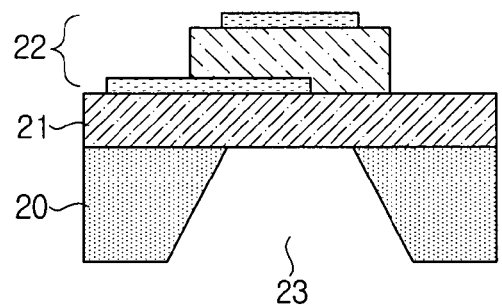
FIG. 1B illustrates a cross-section of a bulk micromachining type FBAR.
Figure 1C:
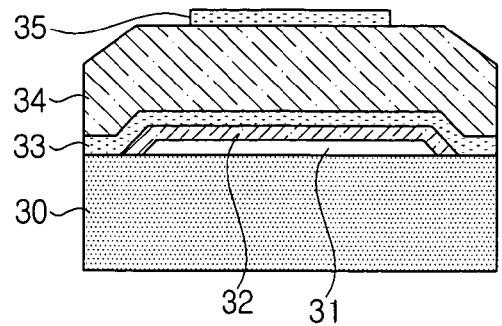
FIG. 1C illustrates a cross-section of a surface micromachining type FBAR.
Figure 2A:
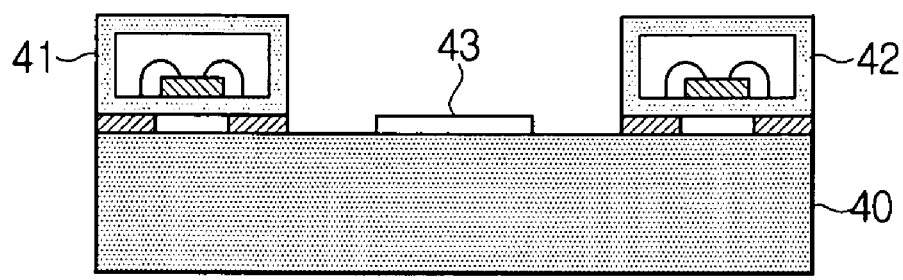
FIG. 2A illustrates a cross-section of a conventional duplexer on a printed circuit board including the FBAR of FIG. 1B or 1C.
Figure 2B:
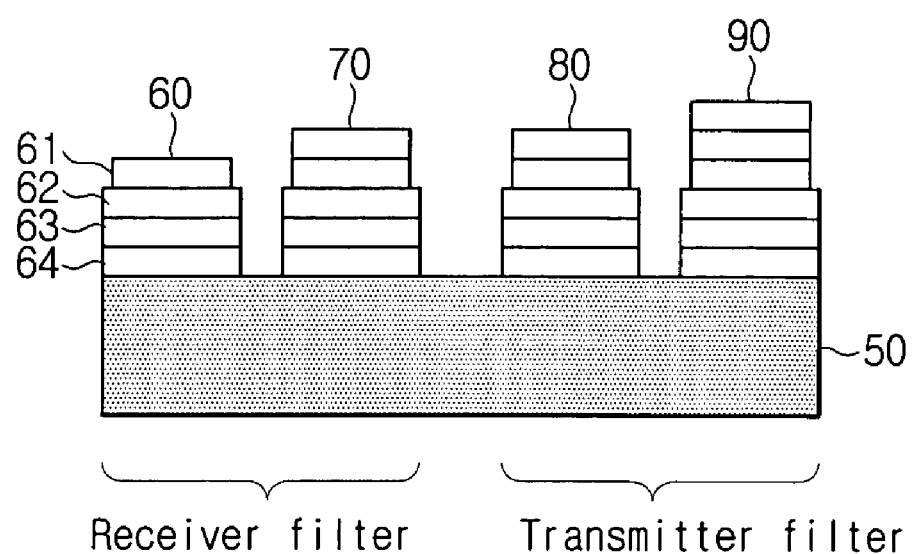
FIG. 2B illustrates a cross-section of a conventional duplexer including the FBAR of FIG. 1A.

Korean Patent Application No. 2003-24720 filed on Apr. 18, 2003 in the Korean Intellectual Property Office, and entitled "FILM BULK ACOUSTIC RESONATOR FABRICATION METHOD USING SUBSTRATE BONDING AND FILM BULK ACOUSTIC RESONATOR FABRICATED BY THE SAME," and Korean Patent Application No. 2003-49918 filed on Jul. 21, 2003 in the Korean Intellectual Property Office, and entitled "ONE-CHIP DUPLEXER FABRICATION METHOD USING SUBSTRATE BONDING AND ONE-CHIP DUPLEXER FABRICATED BY THE SAME," are incorporated herein by reference in their entirety.

Hereinafter, an air-gap type FBAR, a duplexer and a fabricating method thereof according to the present invention will be described in detail with reference to the annexed drawings in which like reference numerals refer to like elements. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present.

Figure 3:
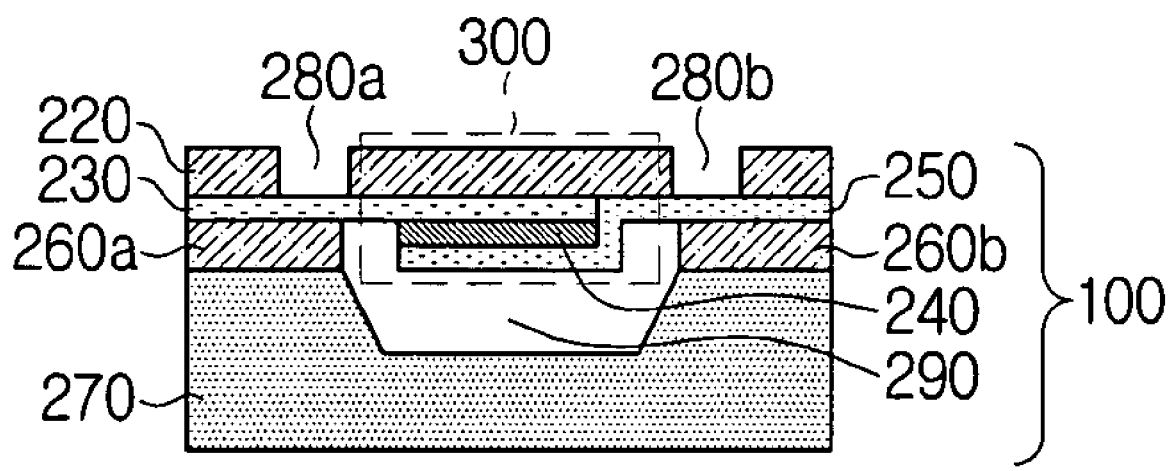
FIG. 3 illustrates a cross-section of an air-gap type FBAR according to an embodiment of the present invention.

FIG. 3 illustrates an air-gap type FBAR fabricated using a substrate securing process. As shown in FIG. 3, a cavity 290 is formed on a predetermined part of a surface of a substrate 270, and a second dielectric layer 260a and 260b is provided on the substrate 270 on opposite sides of the cavity 290. A laminated resonance part 300 includes a first electrode 230, a second electrode 250 and a piezoelectric layer 240 located between the first and second electrodes and within the cavity 290. One end of the first electrode 230 of the laminated resonance part 300 is in contact with one part 260a of the second dielectric layer, and one end of the second electrode 250 is in contact with the other part 260b of the second dielectric layer. Also, the first electrode 230 and the second electrode 250 are packaged by a first dielectric layer 220, and parts of the first electrode 230 and the second electrode 250 are exposed by a via 280a and 280b formed by removing part of the first dielectric layer 220.

When a voltage is applied to the first electrode 230 and the second electrode 250 through vias 280a and 280b, an electric field is generated between the two electrodes. This electric field produces mechanical motion in the piezoelectric layer 240 due to the piezoelectric effect in the form of a bulk acoustic wave to generate resonance. The part that generates the resonance as described above includes the first and second electrodes 230, 250, the piezoelectric layer 240, and the first dielectric layer 220, and is referred to as the resonance part 300.

Figure 4A:
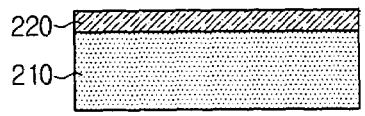
FIGS. 4A to 4J illustrate cross-sections at different stages of fabrication of an air-gap type FBAR according to an embodiment of the present invention.
Figure 4B:
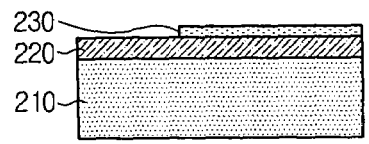
Figure 4C:
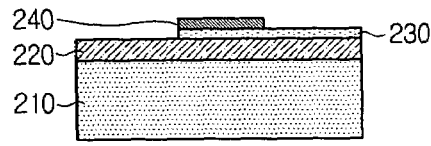
Figure 4D:
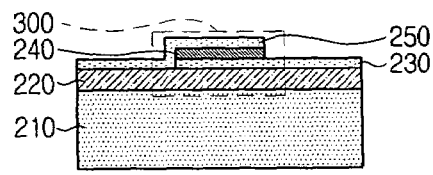
Figure 4E:
Figure 4F:
Figure 4G:
Figure 4H:
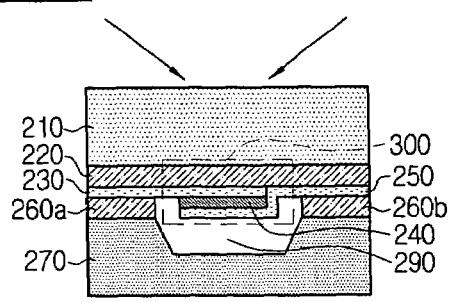
Figure 4I:
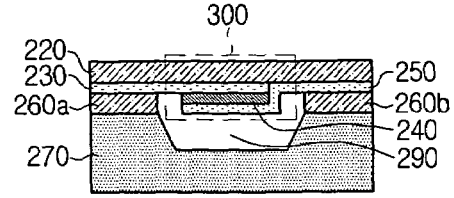
Figure 4J:
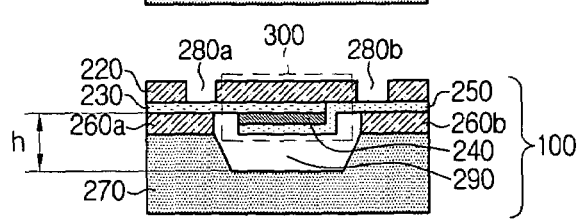

A method of fabricating an air-gap type FBAR having the structure of FIG. 3 is illustrated in detail in FIGS. 4A to 4J. Generally, the method includes forming the laminated resonance part 300 on a first substrate 210, forming the cavity 290 on the second substrate 270, and completing the air-gap type FBAR including securing the second substrate 270 and the first substrate 210. In detail, FIGS. 4A to 4D illustrate the process of fabricating the laminated resonance part, FIGS. 4E to 4G illustrate the process of fabricating the cavity, and FIGS. 4H to 4J illustrate the bonding and finishing process.

As shown in FIG. 4A, the first dielectric layer 220 is deposited on a separate substrate (hereinafter referred to as "first substrate") 210. The first dielectric layer 220 will serve to electrically insulate the first electrode 230 from the first substrate 210 and to facilitate the deposition of the first electrode 230. The substrate 210 maybe an insulating material such as $SiO_2$ and $Al_2O_2$, but is not limited thereto.

A conductive material is selectively deposited, e.g., by depositing, patterning and removing in accordance with the pattern, on the first dielectric layer 220 to form the first electrode 230, as shown in FIG. 4B. The conductive material may be a metal, such as Al, W, Au, Pt, Ni, Ti, Cr, Pd and Mo.

A piezoelectric material is selectively deposited, e.g., by depositing and patterning, on the first electrode 230 to form the piezoelectric layer 240, as shown in FIG. 4C. The piezoelectric layer 240 generates the bulk acoustic wave when an electric signal is applied thereto due to the piezoelectric phenomenon. The piezoelectric material may be AlN or ZnO, but is not limited thereto. The deposition may be performed using RF magnetron sputtering or evaporation.

A second conductive material is selectively deposited, e.g., by depositing and patterning, on the first dielectric layer 220 and the piezoelectric layer 240 to form the second electrode 250, as shown in FIG. 4D. The second conductive material may be any of those noted above for the first electrode, and may be the same material as for the first electrode.

Through the above-described steps, the fabrication of the resonance part 300 with respect to the first substrate 210 is completed.

Meanwhile, with respect to another separate substrate (hereinafter referred to as "second substrate"), the cavity 290 for forming the air gap is created. The cavity 290 isolates the resonance part 300 from the second substrate 270, and thus prevents the acoustic wave generated from the piezoelectric layer 240 from being affected by the second substrate 270. The cavity-formation may be performed as follows.

First, as shown in FIG. 4E, the second dielectric layer 260 is deposited on the second substrate 270. The deposition of the second dielectric layer 260 may be performed in the same manner as the deposition of the first dielectric layer on the first substrate 210.

Then, the second dielectric layer 260 is patterned in a predetermined form, as shown in FIG. 4F. That is, the portion of second dielectric layer 260 that corresponds to where the cavity 290 will be formed on the second substrate 270, is removed.

Then, as shown in FIG. 4G, the cavity 290 is formed by removing, e.g., etching, the substrate 270 part where the second dielectric layer 260 was removed. The depth h of the cavity 290, labeled in FIG. 4J, is large enough to isolate the resonance part 300 from the second substrate 270, and may be approximately in the range of 3 to 5 μm. As discussed in connection with another embodiment below, a passive element and/or an active element may be integrated with the cavity 290 and the depth h of the cavity can be adjusted accordingly. Through the above-described steps, the process for the second substrate 270 is completed.

Finally, in order to fabricate the air-gap type FBAR, the first substrate 210 and the second substrate 270 are secured together.

First, the first substrate 210, in which the resonance part 300 is formed, is secured with the second substrate 270, in which the cavity 290 is formed.

The first and second electrodes 230, 250 of the resonance part 300 of the first substrate 210 and the dielectric layer parts 260a and 260b of the second substrate 270 may be used as securing surfaces. Thus, the resonance part 300 on the first substrate 210 is located within the cavity 290 formed on the surface of the second substrate 270, as shown in FIG. 4H. In the present invention, since the FBAR is fabricated using securing, the air gap does not need to be formed using a separate sacrificial layer and the attendant removal thereof.

The securing may include bonding the first and second substrates 210, 270. Such bonding may include direct bonding that performs the bonding by applying heat, anodic bonding that performs the bonding by applying voltage, adhesive bonding using adhesive such as epoxy, eutectic bonding using metal. Due to low-temperature processing available with adhesive bonding or eutectic bonding, these may be more practical than direct bonding or anodic bonding, which include a high-temperature process.

After the completion of the securing, the first substrate 210 may be removed, as shown in FIG. 4I. The removal of the first substrate 210 may be performed through wet etching using KOH or TMAH (Tetra-Methyl Ammonium Hydroxide), spin etching after lapping, or dry etching after lapping. In order to reduce the stress of the element, dry etching after lapping may be selected. After removing the first substrate part 210, the dielectric layer 220 remains to serve as packaging for the air-gap type FBAR. Accordingly, the cost and effort of providing separate packaging after the fabrication of the FBAR as in the conventional method can be reduced.

Finally, the air-gap type FBAR is completed by patterning the first dielectric layer 220 in order to form vias 280a and 280b for exposing the first and second electrodes 230, 250 to form pads as shown in FIG. 4J. The pads electrically connect the first and second electrodes 230, 250 to external terminals, e.g., by wire, and vias 280a and 280b are the paths for contacting the two terminals in the dielectric layer.

Accordingly, the air-gap type FBAR having a superior reflection characteristic and a stable effective bandwidth can be robustly fabricated through a simple process. Since a separate sacrificial layer removing process is not required, the damage occurring during the removal of the sacrificial layer can be prevented, and the limit on the size of the area can be eliminated. Also, by forming the resonance part and the cavity on separate substrates, the fabricating process is simplified. Further, by creating packaging along with forming FBAR, the cost and effort to perform the separate packaging processes can be reduced.

Also, according to the FBAR of the present invention, the degree of integration of the element can be increased by separately forming a passive element and/or an active element on the substrate 270 having the cavity (i.e., the second substrate) and securing the resonance part 300 thereto. The processing of the second substrate 270 may be compatible with the CMOS processing. The FBAR fabricated as above can be used to create a filter for wireless communication and a duplexer.

Figure 5:
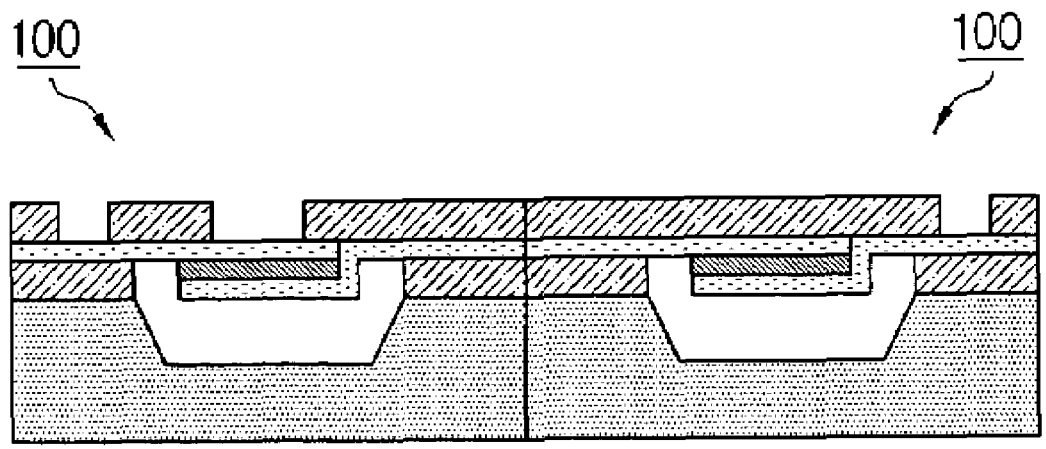
FIG. 5 illustrates a cross-section of a FBAR filter formed by connecting several FBARs according to the present invention.

In one embodiment of the present invention as shown in FIG. 5, a filter can be implemented by connecting FBARs shown in FIG. 3. When using FBARs 100 as a filter as shown in FIG. 5, frequency tuning is required. The resonance part 300 facilitates the frequency tuning by controlling the thickness of the first insulting layer 220 of the resonance part 300. The resonant frequency $f_0$ of the FBAR 100 is determined by the thickness of the laminated resonance part 300 and the properties of its constituent materials. This can be expressed by an approximate equation of $f_0 = v/2l$. In the equation, v is a speed of a bulk acoustic wave in the piezoelectric layer 240, and l is the thickness of the resonance part 300. By controlling the thickness of the first dielectric layer 220, the thickness l of the laminated resonance part 300 can be adjusted, allowing frequency tuning. The controlling of the thickness of the first dielectric layer 220 may include removing a portion of the first dielectric layer 220, e.g., by etching.

Figure 6:
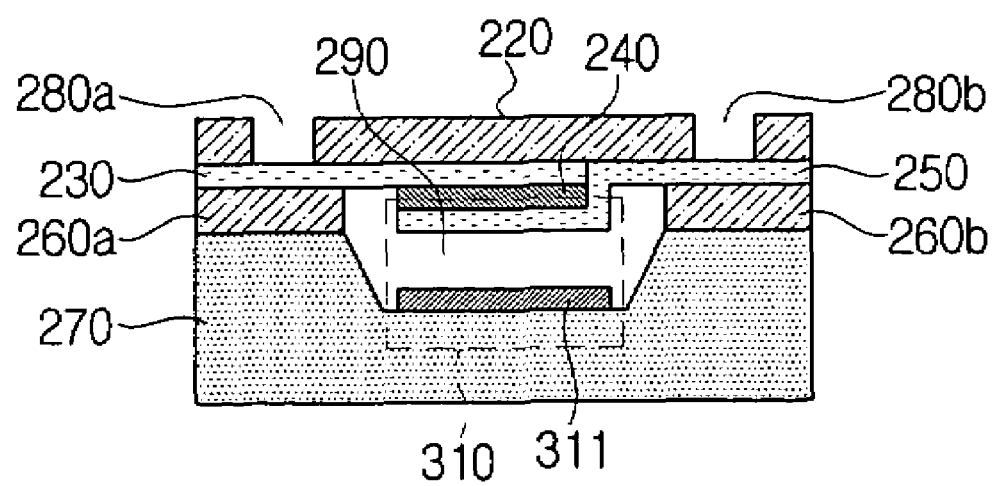
FIG. 6 illustrates a cross-section of an air-gap type FBAR integrated with a capacitor according to an embodiment of the present invention.

In another embodiment of the present invention, a metal layer 311 may be deposited on a bottom surface of the cavity 290 before securing the first and second substrates, as shown in FIG. 6. In this case, the second electrode 250 of the resonance part 300 and the deposited metal layer 311 form a capacitor structure 310. When an electric field is applied to the first and the second electrodes 230 and 250, the resonance is generated, and the resonance part 300 fluctuates, so that the second electrode 250 and the metal layer 311 serve as a variable capacitor. In other words, since the distance d between the second electrode 250 and the metal layer 311 varies due to the fluctuating of the laminated resonance part 300, the capacitance C varies by an equation of $C = \in(A/d)$, where $\in$ is a dielectric constant, A is an area of the electrode part, and d is the distance between the electrodes. This variable capacitor and the bulk acoustic resonator can be integrated into one element.

In this embodiment of the present invention, a passive element and/or an active element, separate from the FBAR, may also be integrated. That is, during the fabrication of the cavity 290 used as the air gap, an integrated element can be fabricated before the securing process by producing a passive element such as an inductor and a capacitor or an active element such as a Complementary Metal Oxide Semiconductor (CMOS) and a diode. Since the processes for the first substrate 210 and the second substrate 270 can be performed separately, creation of such an integrated element only needs to be compatible with the processing of the second substrate 270. Thus, for example, the CMOS can be fabricated on the second substrate 270 using existing CMOS fabricating processes.

Figure 7:
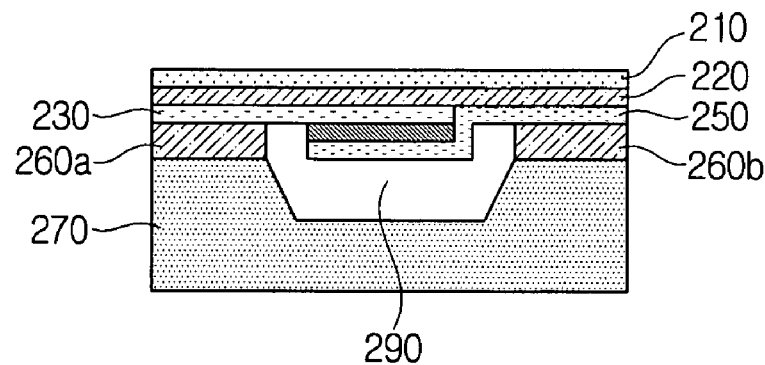
FIG. 7 illustrates a cross-section of a FBAR packaged using a first substrate film according to another embodiment of the present invention.

Meanwhile, in another embodiment of the present invention, rather than completely removing the first substrate 210 as shown in FIG. 4J, a more stable packaging may be realized by leaving a film of the first substrate 210 of a predetermined thickness, as shown in FIG. 7. The thickness of the first substrate film 210 may be within 3 μm and is determined in accordance with a desired degree of stabilization of the element and a degree of deterioration of the resonance due to the addition of the substrate film. As described above, the integration can be performed on the PCB with packaging at a unit element level.

Figure 8:
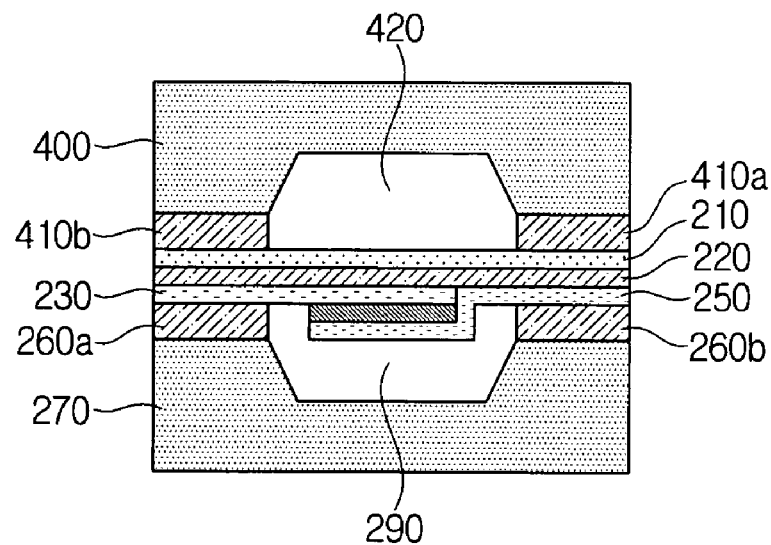
FIG. 8 illustrates a cross-section of an FBAR packaged by bonding a third substrate having a separate cavity according to still another embodiment of the present invention.

In another embodiment of the present invention shown in FIG. 8, a third dielectric layer 410 is deposited on a separate third substrate 400, and a predetermined part of the third dielectric layer 410 is patterned and removed. A cavity 420 is formed in the third substrate 400 where the third dielectric layer 410 was removed. The third substrate 400 is secured to the first substrate film 210 of the FBAR shown in FIG. 7, using the part of the third dielectric layer 410a and 410b as a securing surfaces. In the structure illustrated in FIG. 8, the third substrate 400 and the third dielectric layer 410a and 410b are deposited in addition to the first substrate film 210. Thus, a more stabilized packaging can be achieved.

In the same manner, a more stabilized FBAR can be fabricated by bonding the third substrate onto the FBAR according to the previous embodiment of the present invention in which the first substrate film 210 does not remain (not illustrated).

Figure 9:
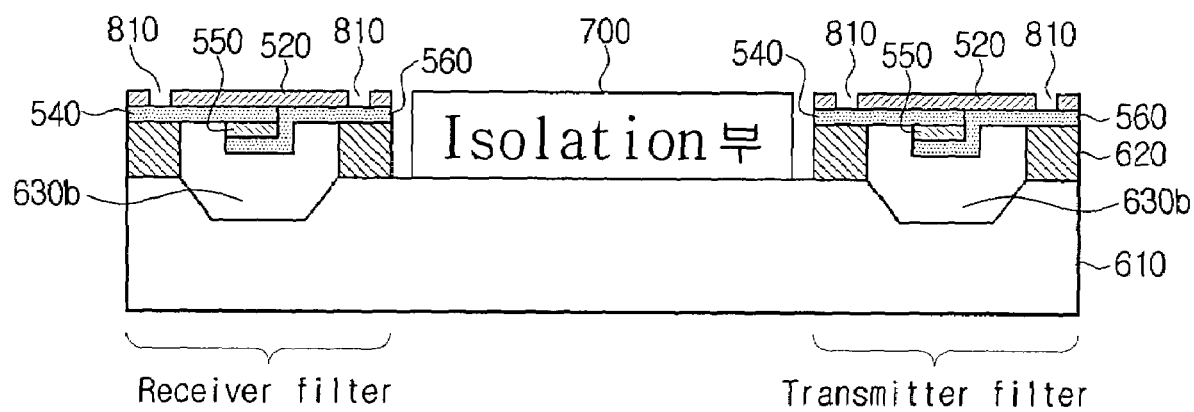
FIG. 9 illustrates a cross-section of a duplexer according to the present invention.

The duplexer shown in FIG. 9 includes a receiver filter, a transmitter filter and an isolation part 700 formed between the receiver filter and the transmitter filter on a substrate 610. The receiver filter and the transmitter filter have the same structure, and hereinafter, the explanation will be made with respect to the receiver filter.

Referring to FIG. 9, an air gap 630b is formed by etching a predetermined part of the substrate 610, and a second dielectric layer 620 is deposited around the air gap 630b. The second dielectric layer 620 serves to insulate the substrate 610 from upper and lower electrodes 560 and 540. One side of the second dielectric layer 620 deposited around the air gap 630b is in contact with the lower electrode 540, and the other side of the second dielectric layer 620 is in contact with the upper electrode 560. A piezoelectric layer 550 is provided between the upper and lower electrodes 560 and 540. When an electric field is applied to the upper and lower electrodes 560 and 540, the piezoelectric layer 550 produces a piezoelectric effect that converts the applied electric signal into a mechanical energy in the form of an acoustic wave, and the air gap 630b reflects the acoustic wave to generate a resonance phenomenon.

A first dielectric layer 520 is provided on an upper part of the upper and lower electrodes 560 and 540. Part of the first dielectric layer 520 is removed to expose parts of the upper and lower electrodes 560 and 540, so that pads 810 are formed. The pads 810 connect the upper and lower electrodes 560 and 540 to external electrodes. The air-gap type FBAR having the above-described structure serves as a kind of band-pass filter.

Meanwhile, a transmitter filter having the same structure as the receiver filter is formed over another air gap 630b. In fabricating the receiver filter and the transmitter filter, by adjusting the thickness of the upper and lower electrodes 560 and 540 and the thickness of the first dielectric layer 520, the resonance frequency can be changed. The transmitter and receiver filters pass only signals having frequencies in their respective resonance frequency bands, making it possible to transmit/receive the signals through one antenna.

Since most systems use similar transmitted/received frequencies, an interference phenomenon may be generated between the transmitter and receiver filters, producing noise during communication. In order to prevent the interference phenomenon, the transmitter and receiver filters are isolated from each other. For this, the isolation part 700 is formed between the transmitter and receiver filters.

The isolation part 700 may include a structure in which a capacitor and an inductor are provided in order. The isolation part 700 serves as a phase shifter for shifting the phases of the frequencies input to the transmitter and receiver. For example, a phase difference of 90° between the frequencies may be introduced. Then, if the transmitted signal flows to the receiver, it is reflected because of the phase difference, thereby preventing interference.

Meanwhile, FIGS. 10A to 10E, 11A to 11C, 12A to 12E, and 13A to 13D illustrate cross-sections during a process of fabricating a single-chip duplexer according to the present invention. FIGS. 12A to 12E show the process of fabricating the isolation part having a specified structure according to an embodiment of the present invention, but the isolation part may have a structure different from that illustrated in FIG. 12.

FIGS. 10A to 10E illustrate cross-section of the process of fabricating the resonance parts of an air-gap type FBAR, which serve as the receiver filter and the transmitter filter of a duplexer, on the first substrate according to the present invention. In this example, two resonance parts are fabricated, but several resonance parts may be fabricated. For example, the filter may be made by connecting several air-gap type FBARs as disclosed below in connection with FIG. 15. In the following description, the first substrate 510 in which the laminated resonance parts are fabricated is called a first substrate part 500 used in the securing process of FIGS. 13A–13D.

Figure 10A:
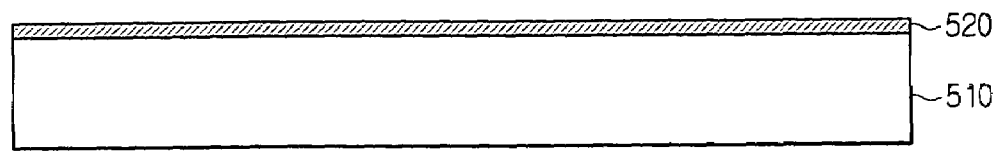
FIGS. 10A to 10E illustrate cross-sections of a process of fabricating resonance parts of an air-gap type FBAR used in a duplexer according to the present invention.
Figure 10B:
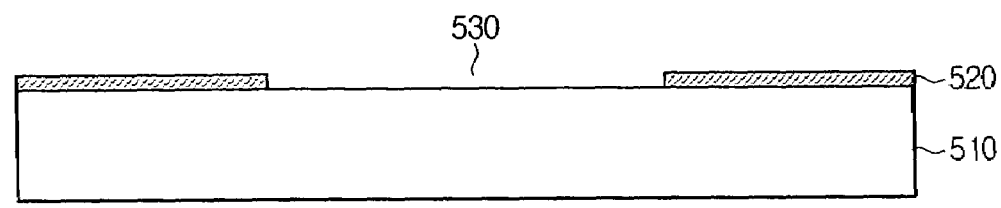

First, a first dielectric layer 520 is deposited on the first substrate 510 as shown in FIG. 10A. Then, part of the first dielectric layer 520 is patterned and removed, as shown in FIG. 10B. The part from which the first dielectric layer 520 is removed corresponds to a part in which the isolation part 700 to be formed. Since the two air-gap type FBARs, which serve as the transmitter and receiver filters, are fabricated using the same method and have the same structure, the description is provided only with respect to the fabrication of one resonance part.

Figure 10C:
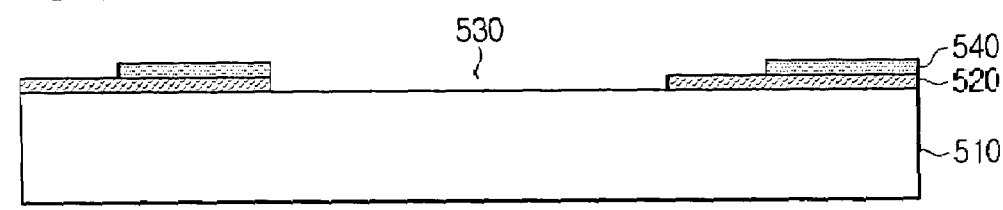

In FIG. 10C, a conductive material is deposited on upper parts of the first dielectric layer 520 separated as above to form the lower electrode 540. The material and the role of the lower electrode 540 are the same as described above. One end of the lower electrode 540 may be aligned with one end of the first dielectric layer. Thus, the lower electrode 540 can strongly support the resonance part.

Figure 10D:
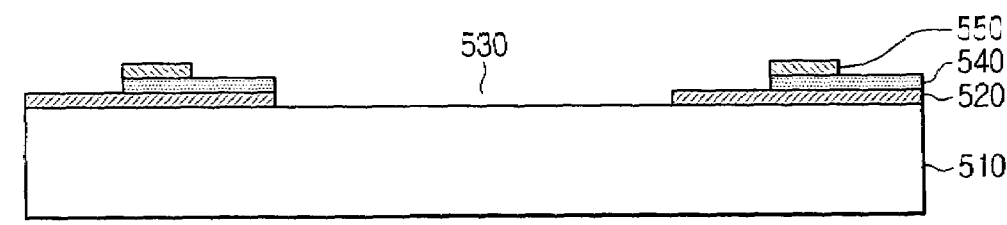
Figure 10E:
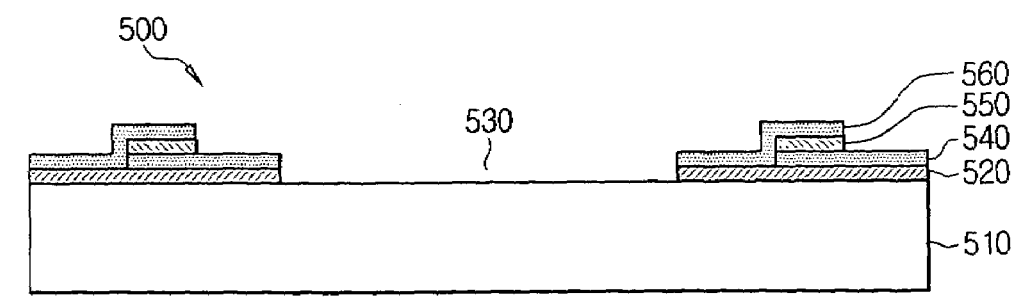

Thereafter, a piezoelectric layer 550 is deposited on a predetermined part of the lower electrode 540, as shown in FIG. 10D. Then, as shown in FIG. 10E, an upper electrode 560 is deposited on the part of the first dielectric layer 520 where the lower electrode 540 is not deposited and on the upper part of the piezoelectric layer 550. In the same method, another resonance part can be fabricated on the opposite part of the first dielectric layer 520. Through the above-described processes, the first substrate part 500 is completely fabricated.

Figure 11A:
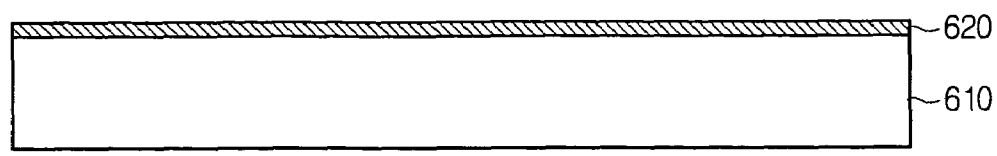
FIGS. 11A to 11C illustrate cross-sections of a process of fabricating air gaps for an air-gap type FBAR used in a duplexer according to the present invention.
Figure 11B:
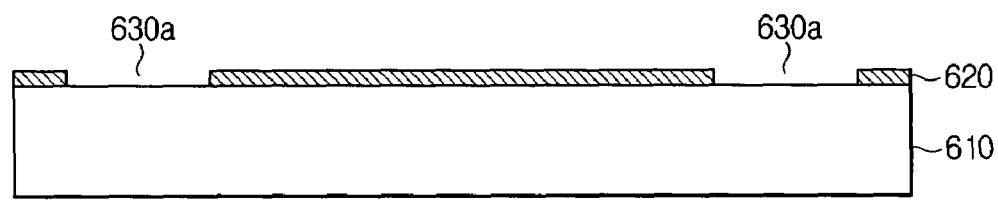
Figure 11C:
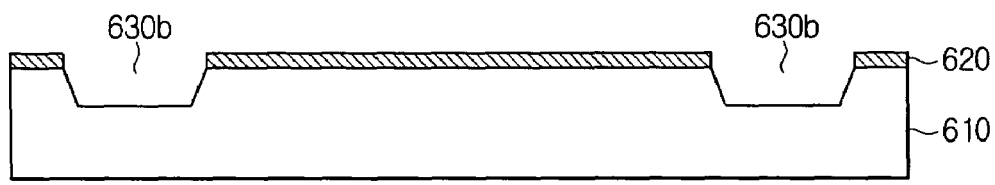

Meanwhile, FIG. 11A to 11C show the process of fabricating the second substrate part by forming air gaps or cavities and the isolation part 700 on a separate substrate. In the following description, the second substrate 610 in which the air gaps and the isolation part 700 are fabricated is called a second substrate part 600 used in the securing of FIGS. 13A–13D.

First, the second dielectric layer 620 is deposited on the second substrate 610 as shown in FIG. 11A. Then, the parts of the second dielectric layer part 620, on which the air gaps 630b are to be formed, are removed as shown in FIG. 11B. Since the number of the air gaps 630b should be equal to the number of laminated resonance parts on the first substrate, the etching of the second dielectric layer 620 is performed accordingly.

Thereafter, the air gaps 630b (or cavities) are formed by removing, e.g., by etching, some of the substrate of the part 630a from which the second dielectric layer 620 has been removed, as shown in FIG. 11C. The depth of the air gap 630b is large enough to isolate the laminated resonance part fabricated on the first substrate from the second substrate 610. When two resonance parts are fabricated on the first substrate, two air gaps 630b are formed. If more than two FBARs are to be employed, the number of the resonance parts and the air gaps is adjusted accordingly.

After the air gaps 630b (or cavities) are formed, the isolation part 700 may be fabricated as shown in FIGS. 12A to 12E. The isolation part 700 may be fabricated by forming a capacitor having two conductive layers and a dielectric layer located between the two conductive layers and by implementing an inductor having a conductive coil.

Figure 12A:
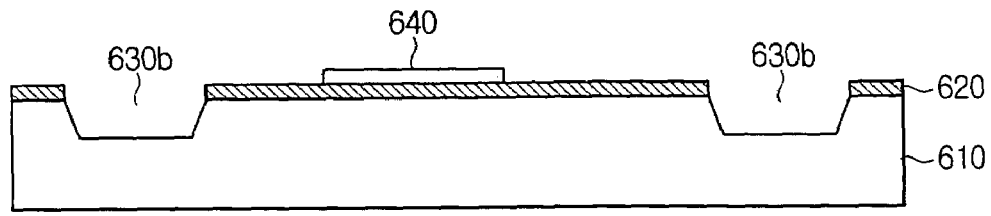
FIGS. 12A to 12E illustrate cross-sections of a process of fabricating an isolation part used in a duplexer according to an embodiment of the present invention.

A first conductive layer 640 is deposited on an upper part of the second dielectric layer 620 between the two air gaps 630b formed on the second substrate 610, as shown in FIG. 12A. The first conductive layer 640 may be a metal, e.g., Au, Cr, and may be formed by electroplating.

Figure 12B:
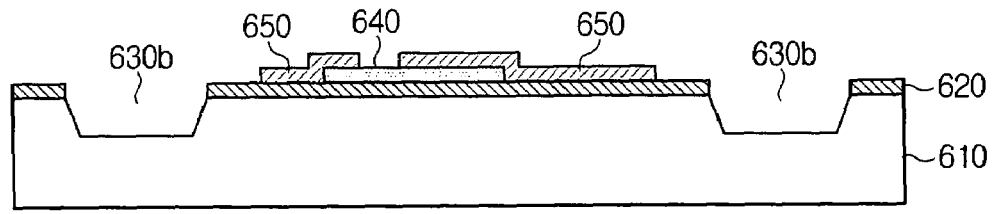

A third dielectric layer 650 is then selectively deposited on the first conductive layer 640 and on the upper part of the second dielectric layer 620, as shown in FIG. 12B. The material of the third dielectric layer 650 may be $Si_3N_4$. The selective provision of the third dielectric layer 650 may include depositing dielectric material using PECVD (Plasma Enhanced Chemical Vapor Deposition) over the entire structure, and then removing a predetermined part of the third dielectric layer 650 using reactive-ion etching, thereby exposing parts of the first conductive layer 640.

Figure 12C:
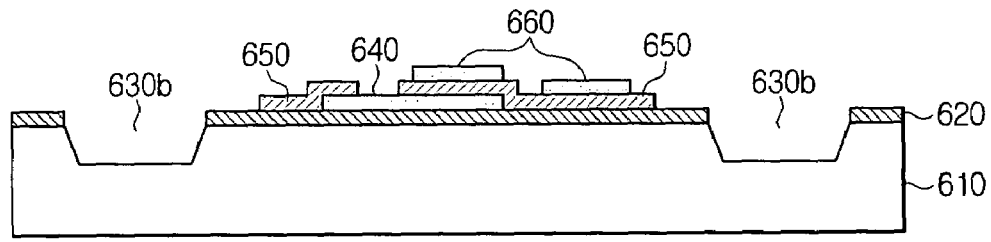

Then, a second conductive layer 660 is deposited on predetermined parts of the third dielectric layer 650, as shown in FIG. 12C. The second conductive layer 660 may be made of the same material as the first conductive layer 640 and deposited using the same method such as electroplating.

Figure 12D:
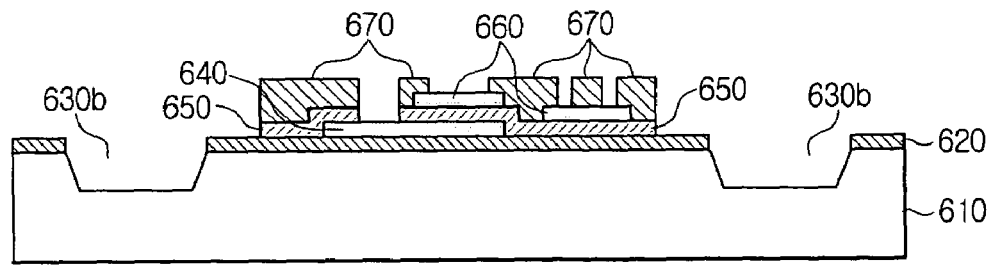

An insulating material, e.g., an organic insulating material (BCB), is provided over the structure show in FIG. 12C. The insulating material may have a low dielectric constant k and a thickness of about 8 μm. Part of the insulating material is removed to expose a predetermined part of the second conductive layer 660 and a predetermined part of the first metal layer 640, as shown in FIG. 12D, thereby forming an insulating film. The insulating film 670 serves as a protective layer for protecting the conductive layers 640, 660 and the dielectric layer 650.

Figure 12E:
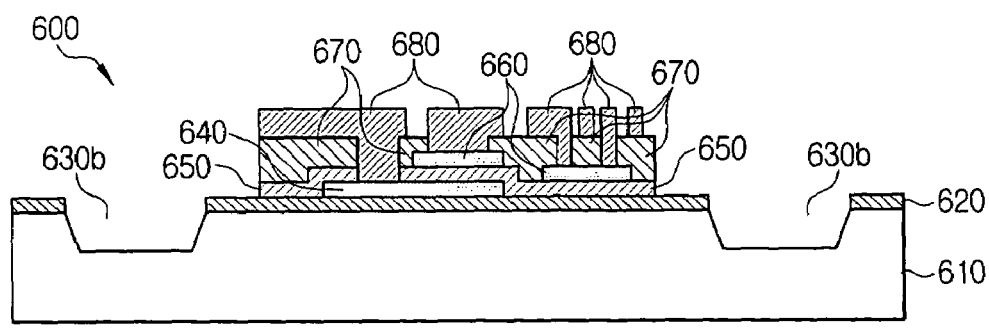

A third conductive layer 680 is provided on predetermined parts of the exposed first conductive layer 640, second conductive layer 660 and organic insulating film 670, as shown in FIG. 12E. The third conductive layer 680 may be a coil, and serves as an inductor. Generally, the third conductive layer 680 may be a metal, e.g., Cu, and may be provided by electroplating. The third conductive layer 680 may be made into the coil by forming a seed layer, forming photoresist film patterns on the seed layer, electroplating a coil material between the photoresist film patterns, and removing the photoresist film patterns, leaving the coil.

After forming of the third conductive layer 680 in the form of a coil, the process of fabricating the isolation part 700, and thus the second substrate part 600, is finished.

FIGS. 13A to 13D illustrate cross-section of the process of securing the first substrate part 500 fabricated through the process as illustrated in FIGS. 10A to 10E to the second substrate part 600 fabricated through the process as illustrated in FIGS. 11A to 11C and 12A to 12E.

Figure 13A:
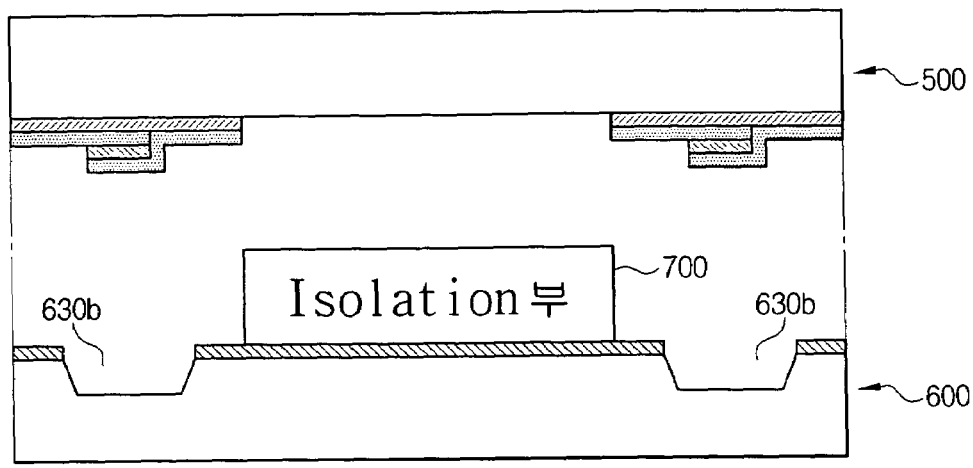
FIGS. 13A to 13D illustrate cross-sections of a process of finally fabricating a duplexer through a securing process according to the present invention.

FIG. 13A shows the alignment of the first substrate part 500 and the second substrate part 600. In particular, the parts 500, 600 are aligned so that the resonance parts of the first substrate part 500 are aligned with the two air gaps 630b or cavities of the second substrate part 600, while the isolation part 700 of the second substrate part 600 is aligned with the part 530 of the first substrate part 500 on which there is no first dielectric layer 520. The securing may be performed using any of the bonding techniques described above, again with adhesive bonding or the eutectic bonding providing advantages. Since the FBARs are fabricated through the securing of two substrates, the use of a separate sacrificial layer and removal thereof as in the conventional method to form the air gap is not needed.

Figure 13B:
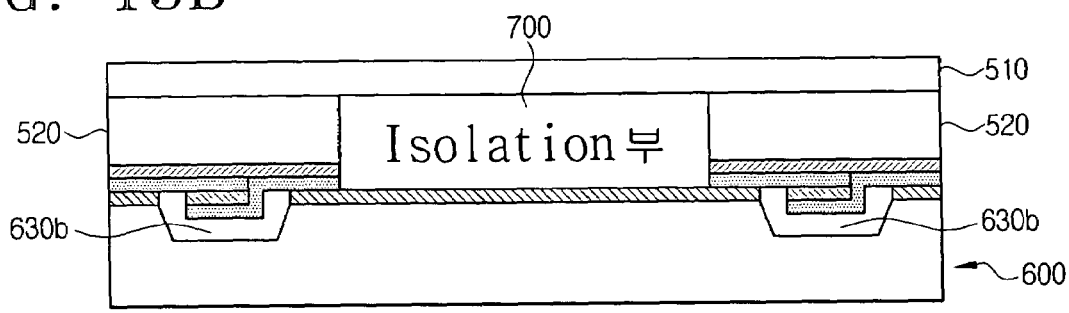
Figure 13C:
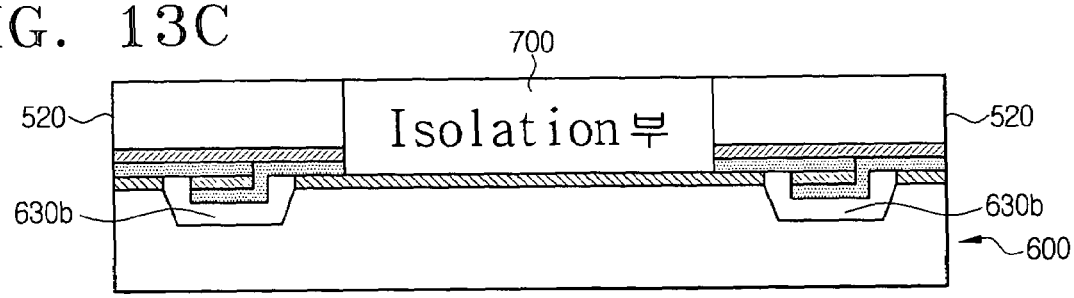

The aligned substrate parts 500, 600 are brought into contact and secured, as shown in FIG. 13B. The substrate 510 of the first substrate part 500 located on the upper part of the duplexer is then removed, as shown in FIG. 13C.

Figure 13D:
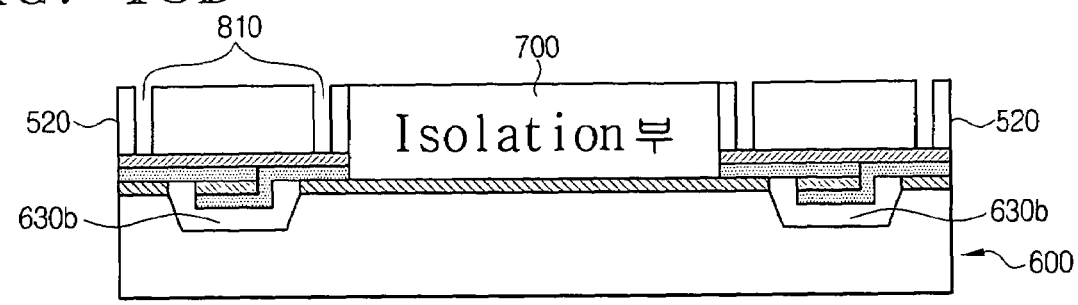
Figure 14:
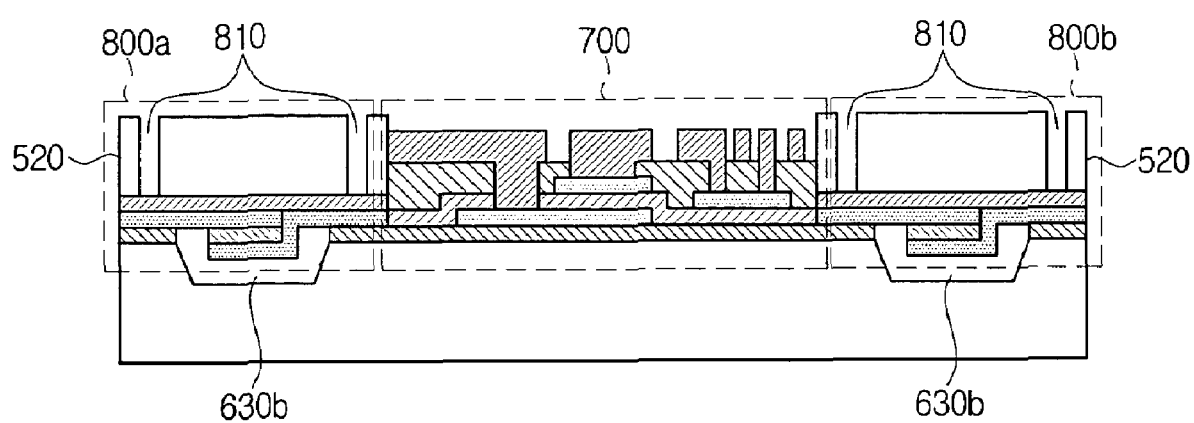
FIG. 14 illustrates a cross-section of a duplexer fabricated using the isolation part illustrated in FIGS. 12A to 12E according to the present invention.

Then, parts of the first dielectric layer 520 under which the lower electrodes and the upper electrodes exist are removed to provide pads 810, as shown in FIG. 13D. As described above, the pads supply an electric field from an external terminal. Thus, a receiver filter 800a, a transmitter filter 800b and an isolation part 700, as shown in FIG. 14, are formed on one substrate to complete a single-chip duplexer.

Since the receiver filter 800a and the transmitter filter 800b used in the duplexer serve as band-pass filters having different resonance frequencies, a frequency tuning process is required. In the present invention, each of the two laminated resonance parts includes the lower electrode 540, the piezoelectric layer 550, the upper electrode 560, and the first dielectric layer 520, shown in FIGS. 9 and 14. Frequency tuning can be readily performed by removing part of the first dielectric layer 520 of the resonance part. The frequency tuning method and principal are as described above.

Figure 15:
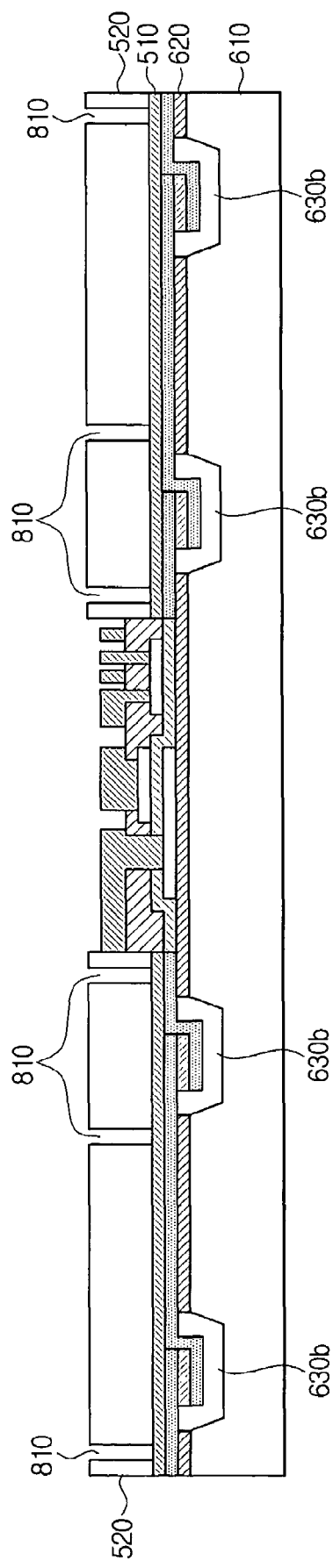
FIG. 15 illustrates a cross-section of a duplexer using transmitter and receiver filters in which several air-gap type FBARs are connected together according to still another embodiment of the present invention.

As shown in FIG. 15, the pass frequency band of the transmitter/receiver can be adjusted by connecting the two FBARs together. In FIG. 15, the duplexer is fabricated using the isolation parts according to an embodiment of the present invention.

In addition to the above, the CMOS can be integrated onto the duplexer. Since the processes for the first substrate part 500 and the second substrate part 600 are separately performed, the duplexer integrated with the CMOS can be fabricated by forming the CMOS using existing CMOS fabricating processes, completing the second substrate part 600 by forming the air gaps and the isolation part on the second substrate, and then securing the first and second substrate parts. In this case, the existing CMOS fabricating equipment and process can be used as is to achieve the compatibility.

As described above, according to the present invention, a small, lightweight duplexer can be fabricated through a simple substrate bonding process, and thus the damage of the substrate can be reduced. Also, since the transmitter and receiver filters and the isolation part are fabricated on separate substrates, the complexity of process caused by depositing different materials on one substrate can be reduced, simplifying the whole process. Also, since the connection between elements is performed on the substrate, in contrast to the conventional method, the parasitic component is reduced, improving the performance of the duplexer.

While embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating an air-gap type film bulk acoustic resonator (FBAR), comprising:
   forming a resonance part on a first substrate, the forming of the resonance part including sequentially providing a first dielectric layer, a first electrode, a piezoelectric layer, and a second electrode on the first substrate;
   forming a cavity in a second substrate;
   securing the first substrate with the second substrate so that the resonance part is located in the cavity;
   packaging including removing the first substrate after the securing; and
   exposing part of the first and second electrodes to form a pad by removing corresponding portions of the first dielectric layer part of the resonance part.

2. The method as claimed in claim 1, wherein the forming of the resonant part includes:
   depositing the first dielectric layer on the first substrate;
   selectively depositing the first electrode on the first dielectric layer;
   selectively depositing the piezoelectric layer on the first electrode and the first dielectric layer; and
   selectively depositing the second electrode on the first electrode, the first dielectric layer and the piezoelectric layer.

3. The method as claimed in claim 1, wherein the forming of the cavity includes:
   depositing a second dielectric layer on the second substrate;
   exposing part of the second substrate surface by removing part of the second dielectric layer; and
   etching the exposed part of the second substrate to form the cavity.

4. The method as claimed in claim 3, wherein the securing of the first and second substrates includes contacting the first substrate and the second dielectric layer on the second substrate.

5. The method as claimed in claim 1, further comprising selectively depositing a conductive layer on a bottom surface of the cavity before the securing.

6. The method as claimed in claim 1, further comprising integrating a specified element on a bottom surface of the cavity before the securing.

7. The method as claimed in claim 6, wherein the element includes at least one of a passive element and an active element.

8. The method as claimed in claim 1, further comprising tuning a resonance frequency by controlling a thickness of the first dielectric layer in the resonance part.

9. The method as claimed in claim 1, wherein the securing includes bonding using one of adhesive bonding and eutectic bonding.

10. The method as claimed in claim 1, wherein the packaging includes etching the first substrate to a predetermined thickness.

11. The method as claimed in claim 10, wherein the packaging includes:
   selectively depositing a third dielectric layer on a third substrate leaving an exposed part of the third substrate;
   forming another cavity by etching the exposed part of the third substrate; and
   securing the third substrate with the first substrate at the third dielectric layer.

12. A method of fabricating a single-chip duplexer using an air-gap type film bulk acoustic resonator (FBAR) filter, comprising:
   forming a first substrate part having first and second resonance parts formed at predetermined intervals on a surface of a first substrate;
   forming a second substrate part including
      forming first and second cavities at the predetermined intervals on a second substrate, and
      forming an isolation part between the first and second cavities;
   securing the first substrate part and the second substrate part so that the isolation part is located between the first and second resonance parts and the first and second resonance parts are over the first and second cavities, respectively; and
   removing the first substrate of the first substrate part after the securing.

13. The method as claimed in claim 12, wherein the forming of the first substrate part includes:
   selectively depositing a first dielectric layer on the first substrate to form first and second dielectric portions;
   depositing first and second lower electrodes on part of the first and second dielectric portions, respectively;
   forming first and second piezoelectric layers on part of the first and second lower electrodes, respectively; and
   depositing first and second upper electrodes on the piezoelectric layers and on part of the first and second dielectric portions not having the first and second lower electrodes, respectively.

14. The method as claimed in claim 12, wherein the forming of the second substrate part includes:
   selectively depositing a second dielectric layer on the second substrate forming first and second dielectric portions spaced apart from each other at a distance corresponding to a distance between the first and second resonance parts; and
   etching the second substrate without the second dielectric layer to form the first and second cavities.

15. The method as claimed in claim 12, wherein the forming of the second substrate further includes:
   forming a capacitor having two conductive layers and a dielectric layer between the two conductive layers; and
   forming a coil of another conductive layer on an upper part of the capacitor to form an inductor.

16. The method as claimed in claim 12, wherein the forming of the second substrate part further includes:
   depositing a first conductive layer on part of the second dielectric layer located between the first and second cavities;
   depositing a third dielectric layer on part of the first conductive layer and on the second dielectric layer;
   depositing a second conductive layer on the third dielectric layer over the first conductive layer and on part of the third dielectric layer not over the first conductive layer;
   coating an insulating film on part of the second conductive layer and on part of the third dielectric layer; and
   depositing a third conductive layer including forming a coil on exposed first and second conductive layers and on part of the insulating film.

17. The method as claimed in claim 12, further comprising forming a pad by removing part of the first dielectric layer to expose lower and upper electrodes of the first and second resonance parts.

18. The method as claimed in claim 12, wherein the securing includes bonding the first and second substrate parts using one of adhesive bonding and eutectic bonding.

19. The method as claimed in claim 12, wherein at least two resonance parts are formed on the first substrate, and at least two cavities are formed on the second substrate, a number of resonance parts being equal to a number of cavities.

* * * * *